(12) United States Patent
Haemmerli et al.

(10) Patent No.: US 12,120,957 B2
(45) Date of Patent: Oct. 15, 2024

(54) RECHARGING DEVICE FOR AN ELECTRONIC OR ELECTROMECHANICAL WATCH AND ASSEMBLY THEREOF

(71) Applicant: The Swatch Group Research and Development Ltd, Marin (CH)

(72) Inventors: Alexandre Haemmerli, Neuchatel (CH); Lionel Tombez, Bevaix (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 16/210,021

(22) Filed: Dec. 5, 2018

(65) Prior Publication Data
US 2019/0198743 A1    Jun. 27, 2019

(30) Foreign Application Priority Data
Dec. 22, 2017 (EP) ..................... 17210025

(51) Int. Cl.
*H10N 10/17* (2023.01)
*G04C 10/02* (2006.01)
(Continued)

(52) U.S. Cl.
CPC ............ *H10N 10/17* (2023.02); *G04C 10/02* (2013.01); *G04G 19/02* (2013.01); *H02J 7/0042* (2013.01);
(Continued)

(58) Field of Classification Search
CPC ... H01L 31/02008; G04C 10/02; G04C 10/00; H10N 10/17; G04G 19/02; H02J 7/0042;
(Continued)

(56) References Cited

U.S. PATENT DOCUMENTS

| 4,026,637 A * | 5/1977 | Yamazaki ......... G02F 1/133553 349/162 |
| 6,172,943 B1 * | 1/2001 | Yuzuki ................... G04G 19/00 368/204 |

(Continued)

FOREIGN PATENT DOCUMENTS

| CN | 205450582 U | 8/2016 |
| CN | 206314705 U | 7/2017 |

(Continued)

OTHER PUBLICATIONS

English machine translation of DE 202009003029U1. (Year: 2009).*

(Continued)

*Primary Examiner* — Michael Y Sun
(74) *Attorney, Agent, or Firm* — Oblon, McClelland, Maier & Neustadt, L.L.P.

(57) ABSTRACT

A recharging device for an electronic or electromechanical watch equipped, on the one hand, with a device for the storage of electrical energy for powering electronic components of the watch and, on the other hand, with an auxiliary source of electrical energy adapted to power the device for the storage of electrical energy for recharging thereof. The device includes a casket provided with a support for receiving the watch. The device further includes at least one source of energy configured to supply energy to the auxiliary source of electrical energy, when the watch is placed on the receiving support, so that the auxiliary source of electrical energy converts the received energy into electrical energy and delivers a charge for maintaining a predetermined level of power supply voltage to the device for the storage of electrical energy.

12 Claims, 2 Drawing Sheets

(51) Int. Cl.
*G04G 19/02* (2006.01)
*H02J 7/00* (2006.01)
*H02J 7/34* (2006.01)
*H02J 7/35* (2006.01)

(52) U.S. Cl.
CPC .............. *H02J 7/0044* (2013.01); *H02J 7/34* (2013.01); *H02J 7/35* (2013.01)

(58) Field of Classification Search
CPC .... H02J 7/0044; H02J 7/34; H02J 7/35; H02J 7/32; H02N 11/002
See application file for complete search history.

(56) References Cited

U.S. PATENT DOCUMENTS

| | | | | |
|---|---|---|---|---|
| 2007/0006328 | A1* | 1/2007 | Sogo | G06F 21/31 726/34 |
| 2009/0200183 | A1* | 8/2009 | Dussin | A45C 15/06 206/6.1 |
| 2014/0132201 | A1* | 5/2014 | Tsang | H02J 50/30 320/137 |
| 2014/0177400 | A1* | 6/2014 | Born | G04C 1/00 368/207 |
| 2015/0373786 | A1 | 12/2015 | Newman et al. | |
| 2016/0218550 | A1 | 7/2016 | Macwilliams | |
| 2016/0218553 | A1* | 7/2016 | He | H02J 7/0044 |
| 2016/0299475 | A1* | 10/2016 | Baba | H04B 5/0081 |
| 2017/0094399 | A1* | 3/2017 | Chandramohan | H04R 5/033 |

FOREIGN PATENT DOCUMENTS

| | | | |
|---|---|---|---|
| CN | 107065508 A | 8/2017 | |
| DE | 202009003029 U1 * | 6/2009 | ............ G04C 10/02 |
| DE | 202014008547 U1 * | 3/2015 | |
| EP | 2 384 621 A1 | 11/2011 | |
| EP | 3 096 191 A1 | 11/2016 | |
| FR | 2 955 457 A3 | 7/2011 | |
| JP | 53-102667 U1 | 8/1978 | |
| JP | 54-036029 U1 | 3/1979 | |
| JP | 11-176491 A | 7/1999 | |
| JP | 2002-51474 | 2/2002 | |
| JP | 2009-5426 A | 1/2009 | |
| JP | 2012-137830 A | 7/2012 | |
| WO | WO 2015/195559 A1 | 12/2015 | |
| WO | 2016/118853 A1 | 7/2016 | |

OTHER PUBLICATIONS

English machine translation of DE 202014008547U1. (Year: 2015).*
European Search Report Issued Jun. 12, 2018 in European Application 17210025.7 filed on Dec. 22, 2017 (with English Translation of Categories of Cited Documents).
Japanese Final Rejection and Decision of Dismissal of Amendment issued Oct. 27, 2020 in corresponding Japanese Patent Application No. 2018-230594 (English translation only), 4 pages.
Notice of the Reason for Refusal mailed Dec. 14, 2021 in corresponding Japanese Patent Application No. 2018-230594 (with English translation)(12 pages).
Combined Chinese Office Action and Search Report issued Jul. 19, 2022 in Chinese Patent Application No. 201811591419.3 (with English translation), 11 pages.

* cited by examiner

RECHARGING DEVICE FOR AN ELECTRONIC OR ELECTROMECHANICAL WATCH AND ASSEMBLY THEREOF

CROSS-REFERENCE TO RELATED APPLICATION

This application claims priority to European Patent Application No. 17210025.7 filed on Dec. 22, 2017. the entire disclosure of which is hereby incorporated herein by reference.

TECHNICAL FIELD OF THE INVENTION

The invention relates to a recharging device for an electronic or electromechanical watch, more particularly a box for an electronic or electromechanical watch adapted to recharge a suchlike watch.

The invention also relates to an assembly comprising the recharging device and an electronic or electromechanical watch, equipped on the one hand with a means for the storage of electrical energy for powering the electronic components of the watch, and on the other hand with an auxiliary source of electrical energy adapted to power the means for the storage of electrical energy for recharging thereof.

PRIOR ART

A mechanical watch may be either manually wound or automatically wound. The advantage of automatic winding for a mechanical watch is that the watch rewinds itself automatically via an oscillating mass when it is being worn on a person's wrist. The watch never stops, therefore, if it is worn regularly. As long as the watch is being worn, it will not stop due to the daily movements of the person. Devices, referred to as winders, are known in this field of mechanical watches, which allow an automatically wound mechanical watch to be kept in movement, even when it is not being worn. Suchlike winders, which are in the form of boxes, for example, typically comprise vibrating means connected to a motor in order to impart a slow rotation to the watch, and, in so doing, to reload the mainspring of the watch via the oscillating mass. Suchlike winders thus prevent the watch from stopping, and permit the latter to continue to run at a constant amplitude and thus to keep good time. Patent Application WO 2012/126978 A1 describes, for example, a suchlike winder for a mechanical watch. However, a disadvantage of suchlike winders for mechanical watches is that they do not permit recharging of an electronic or electromechanical watch equipped with a means for the storage of electrical energy that is rechargeable in an autonomous manner. A suchlike electronic or electromechanical watch is typically a solar-powered watch or even a thermic or thermoelectric watch.

In the case of a solar-powered watch, the solar energy is typically transformed into electrical energy by means of a photovoltaic cell playing the role of an auxiliary source of electrical energy for the watch. The photovoltaic cell is connected to a storage battery for the electrical energy, the latter causing the movement of the watch to operate. When the watch is kept in a location without light, such as a drawer or a safe-deposit box, for example, the battery is no longer able to charge and the watch will stop once the battery is flat. In order to prevent a complete discharge of the watch, a known solution involves keeping the watch in an illuminated location when it is not being worn. However, a suchlike solution is unreliable and relatively restrictive, because suchlike illuminated locations are not always available.

In the case of a thermic or thermoelectric watch equipped with a thermoelectric generator, for example, the watch operates thanks to the thermal losses from the body of the person wearing the watch. The thermoelectric generator, which plays the role of an auxiliary source of electrical energy, converts these thermal losses into electrical energy in order to power the battery. The energy stored in the battery makes it possible to cause the watch to operate for a certain period of time. The battery is discharged when the watch is not being worn, however, which may lead to a complete discharge of the battery after a certain period of time and thus to stopping of the movement of the watch.

SUMMARY OF THE INVENTION

The aim of the invention is thus to provide a recharging device for an electronic or electromechanical watch equipped with a rechargeable means for the storage of electrical energy, allowing the means for the storage of electrical energy for the watch to be recharged automatically, in an easy and non-restrictive manner, and addressing the above-mentioned disadvantages of the prior art.

For this purpose, the invention relates to a recharging device for an electronic or electromechanical watch equipped, on the one hand, with a means for the storage of electrical energy for powering the electronic components of the watch and, on the other hand, with an auxiliary source of electrical energy adapted to power the means for the storage of electrical energy for recharging thereof, the device comprising a casket provided with a support for receiving the watch, wherein the device further comprises at least one source of energy configured to supply energy to the auxiliary source of electrical energy for the watch, when the watch is placed on the receiving support.

An advantage of the recharging device according to the invention resides in the fact that the device comprises at least one source of energy configured to supply energy to the auxiliary source of electrical energy when the watch is placed on the receiving support. The auxiliary source of electrical energy thus converts the received energy directly into electrical energy without passing through an intermediate mechanical conversion, and delivers a charge for maintaining a predetermined level of power supply voltage to the means for the storage of electrical energy. This permits the means for the storage of electrical energy for the watch to be recharged automatically, when the watch is not being worn, and in an easy and non-restrictive manner. The recharging device according to the invention advantageously permits a complete discharge of the watch to be avoided, and thus any loss of time and/or date resulting therefrom.

Another advantage of the recharging device according to the invention is that it does not require any galvanic contact between the watch and the device in order to perform recharging of the watch. Electrical recharging of the watch is then performed in a particularly easy manner.

According to a first embodiment of the invention, said at least one source of energy is a source of light, the device being a recharging device for a solar-powered watch, the auxiliary source of electrical energy for the watch being adapted to convert luminous energy into electrical energy.

Advantageously, the recharging device comprises means for optimizing the light spectrum of the source of light, depending on at least one predetermined characterizing feature of the auxiliary source of electrical energy for the watch. This allows the light spectrum of the source of light to be adapted to the performance of the auxiliary source of electrical energy for the watch, permitting optimal recharging of the watch with minimal consumption by the recharging device. In addition, the light spectrum may omit the infra-red part, which may heat the watch and, in the fullness of time, degrade it as well as the recharging device.

According to a second embodiment of the invention, said at least one source of energy is a thermal source configured to apply a temperature gradient in the interior of the device, the device being a recharging device for a thermic or thermoelectric watch, the auxiliary source of electrical energy for the watch being adapted to convert thermal energy into electrical energy.

Advantageously, the recharging device comprises means for optimizing the thermal gradient in the interior of the device, depending on at least one predetermined characterizing feature of the watch and/or of the auxiliary source of electrical energy for the watch. This permits the thermal gradient applied in the interior of the device to be adapted to the construction of the watch and/or to the performance of the auxiliary source of electrical energy for the watch, permitting optimal recharging of the watch with minimal consumption by the recharging device.

Advantageously, the recharging device comprises a folding piece mounted on the casket and a sensor for the presence of the watch and/or the closing of the folding piece, said sensor being connected to the source of energy, the source of energy being configured to trigger the release of energy intended for the auxiliary source of electrical energy for the watch on the basis of a detection signal received from the sensor. This permits the process of recharging the watch to be automated completely, from the moment when the watch is placed on the receiving support and/or the folding piece is closed.

Advantageously, the electronic or electromechanical watch further comprises an energy extractor connecting the auxiliary source of electrical energy to the means for the storage of electrical energy, the source of energy being configured to supply energy to the auxiliary source of electrical energy, when the watch is placed on the receiving support, so that said auxiliary source of electrical energy converts the received energy into electrical energy by means of the energy extractor. This facilitates the extraction of energy from the source of energy and its conversion into electrical charges in order to accumulate these charges on the means for the storage of electrical energy for the watch.

For this purpose, the invention also relates to an assembly comprising an electronic or electromechanical watch equipped, on the one hand, with a means for the storage of electrical energy for powering electronic components of the watch and, on the other hand, with an auxiliary source of electrical energy adapted to power the means for the storage of electrical energy directly and electrically without intermediate mechanical conversion for recharging thereof, the assembly further comprising a recharging device for the watch.

BRIEF DESCRIPTION OF THE FIGURES

The aims, advantages and characterizing features of the recharging device for an electronic or electromechanical watch, and also of the assembly thereof, will be appreciated more clearly in the following description on the basis of at least one non-restrictive embodiment illustrated by the drawings, in which.

DETAILED DESCRIPTION OF THE INVENTION

In the following description, reference is made to a recharging device for an electronic or electromechanical watch, more particularly a box for an electronic or electromechanical watch. All the electronic components of the recharging device, which are familiar to a person skilled in the art in this technical field, are described only in a simplified manner. In particular, a person skilled in the prior art will be able to adapt these different electronic components and make them cooperate for the operation of the device.

Figure 1:
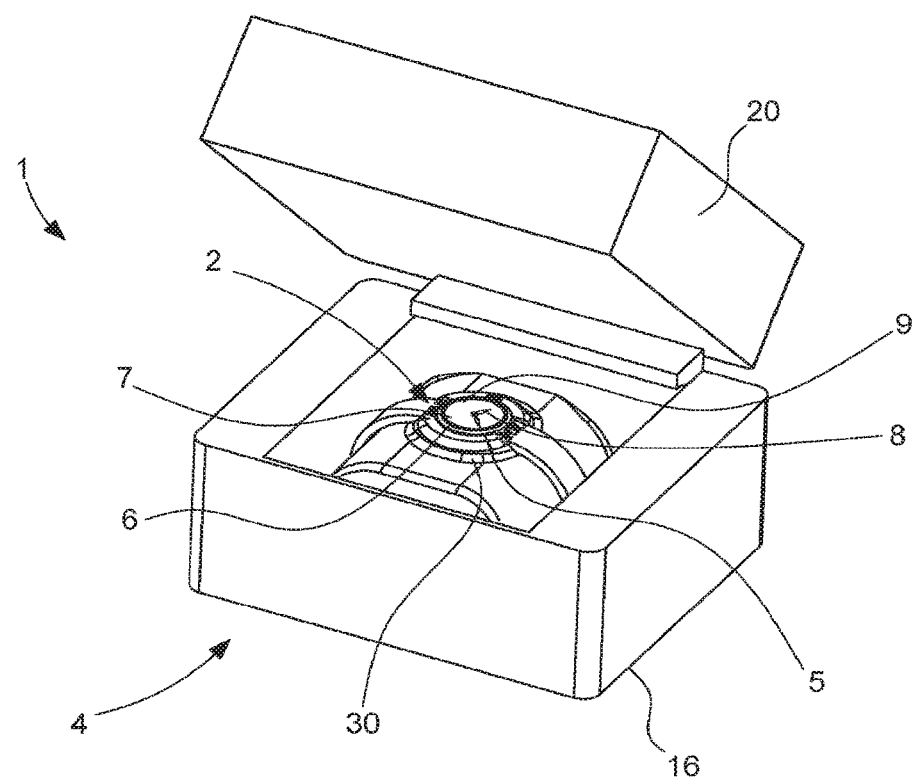
FIG. 1 is a perspective view of an assembly comprising an electronic or electromechanical watch and a recharging device according to the invention, the recharging device being in the form of a box.
Figure 2:
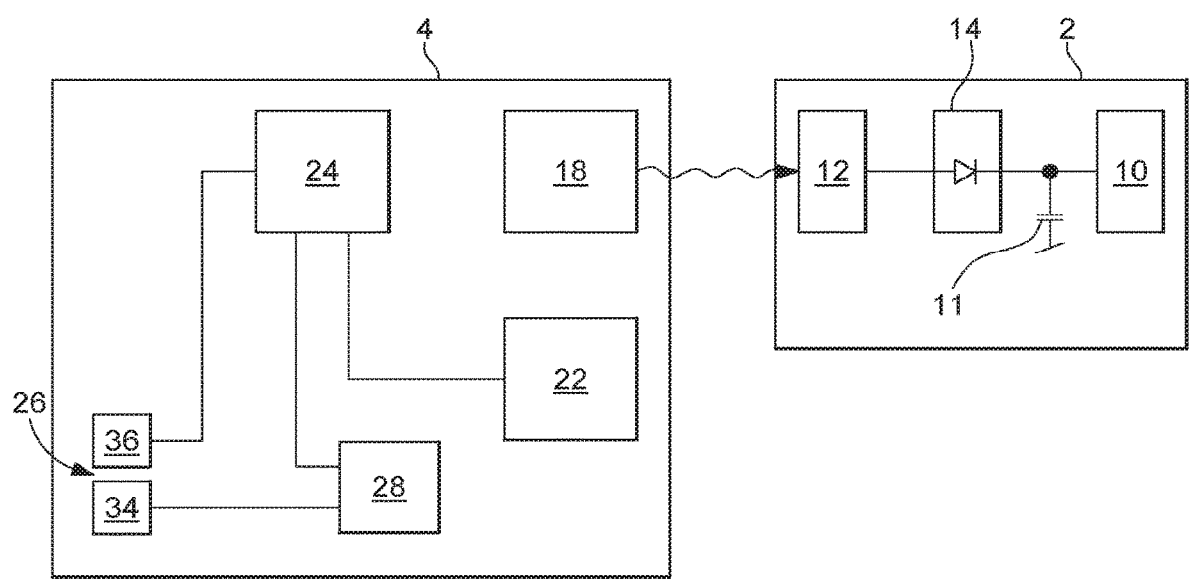
FIG. 2 depicts a simplified bloc diagram of the electronic components of the watch and of the recharging device in FIG. 1 according to an illustrative embodiment.

FIGS. 1 and 2 depict an assembly 1, which comprises an electronic or electromechanical watch 2 and a device 4 for recharging the watch 2. The electronic or electromechanical watch 2 is equipped with a watch case 5. The watch case 5 comprises a case middle 6. The watch case 5 encloses a watch movement (not depicted) of the usual construction, as well as a dial 7 above which display means move, for example formed by hands 8. The dial 7 is protected by a glass 9, which encloses the watch case 5. In the conventional manner, the watch case 5 also encloses electronic components 10 requiring an electrical power supply, as well as means for the storage of electrical energy 11 for powering the electronic components 10 of the watch 2. The watch 2 further comprises an auxiliary source of electrical energy 12 adapted to power the means for the storage of electrical energy 11 for recharging thereof. The auxiliary source of electrical energy 12 may be arranged in the interior of the watch case 5 or, as a variant, may be disposed on the exterior thereof, for example on the glass 9 or the case middle 6 or the bracelet of the watch. Preferably, as illustrated in FIG. 2, the watch 2 also comprises an energy extractor 14 connecting the auxiliary source of electrical energy 12 to the means for the storage of electrical energy 11. The watch 2 is a quartz watch or a hybrid mechanical watch, for example, but without this being restrictive in the context of the present invention.

The recharging device 4 comprises a casket 16. In the illustrative example in FIG. 1, the recharging device 4 is a box for holding the watch 2. However, this is in no way restrictive in the context of the present invention, and the recharging device 4 may, as a variant, adopt any other form having a casket, other than a box.

As illustrated in FIG. 2, the recharging device 4 further comprises at least one source of energy 18. In the illustrative embodiment illustrated in FIG. 1, the recharging device 4 further comprises a folding piece 20, mounted on the casket 16. In the case in which the recharging device 4 is a box for holding the watch 2, the folding piece 20 is typically a lid for closing the box. According to a preferred illustrative embodiment illustrated in FIG. 2, the recharging device 4 also comprises a sensor 22 for the presence of the watch 2 and/or the closing of the folding piece 20. Preferably, the recharging device 4 may also include data analysis means 24, communication means 26 and electrical power supply means 28.

Preferably, the recharging device 4 is configured to contain a predefined type and/or form of electronic or electromechanical watch 2. In order to do this, the casket 16 comprises a support 30 for receiving the watch 2, adapted to the type and/or to the form of the watch 2.

As detailed below, the source of energy 18 is configured to supply energy to the auxiliary source of electrical energy 12 when the watch 2 is placed on the receiving support 30, so that the auxiliary source of electrical energy 12 converts the received energy into electrical energy and delivers a charge for maintaining a predetermined level of power supply voltage to the means for the storage of electrical energy 11. This conversion of electrical energy may be facilitated, for example, by the energy extractor 14. The energy extractor 14, which comprises an oscillating circuit of the LC type, a clock signal generator such as a quartz oscillator, and one or a plurality of switches associated with a common control circuit, for example, thus facilitates the extraction of electrical charges from the auxiliary source of electrical energy 12 and permits the accumulation of these charges on the means for the storage of electrical energy 11 for the watch 2. As depicted in FIG. 2, the means for the storage of electrical energy 11 is an electrical capacitor, for example. As a variant, the means for the storage of electrical energy 11 is a battery.

The sensor 22 for the presence of the watch 2 and/or the closing of the folding piece 20 is connected to the data analysis means 24, which are themselves connected to the source of energy 18. The sensor 22 for the presence of the watch 2 and/or the closing of the folding piece 20 is secured in the recharging device 4, for example in the interior or on the exterior of the receiving support 30. The sensor 22 for the presence of the watch is a touch sensor, for example, arranged in the recharging device 4 so as to be facing towards the side of the back 32 of the watch case 5 when the watch 2 is placed on the receiving support 30, facing towards this back 32. In a variant, not depicted here, the sensor for the presence of the watch 2 and/or the closing of the folding piece 20 is constituted by an optical system for detecting the position of the hands 8 of the watch 2, such as an optical sensor or a camera, for example. The data analysis means 24 are configured, for example, to trigger an energy emission process intended for the auxiliary source of electrical energy 12 for the watch 2 on the basis of a detection signal received from the sensor 22, as detailed below.

As depicted in FIG. 2, the data analysis means 24 are connected in addition to the communication means 26 and to the electrical power supply means 28. The data analysis means 24 are constituted, for example, by a microprocessor. In particular, the microprocessor stores a time reference.

As illustrated in FIG. 2, the communication means 26 comprise, for example, a micro-USB connector (from the English Universal Serial Bus) 34 and a communication interface 36. The micro-USB connector 34 is connected to the electrical power supply means 28 and is intended to permit electric recharging of the latter, via an external source of electrical supply compatible with the USB format. The communication interface 36 is a touch-screen, for example, permitting a user to enter useful information, more particularly information relating to the type or the model of the watch 2. Suchlike information, once it has been communicated to the data analysis means 24, then makes it possible to access predetermined characterizing features of the auxiliary source of electrical energy 12 for the watch 2, more particularly characterizing features of the thermal or luminous power, or of the light spectrum. This is made possible, for example, by a correspondence table stored in the analysis means 24.

The electrical power supply means 28 comprise, for example, a charger/accumulator assembly, more particularly in the case in which the communication means 26 comprise a micro-USB connector 34. As a variant, the electrical power supply means 28 comprise a rechargeable or non-rechargeable battery. As a further variant, the electrical power supply of the recharging device 4 is supplied by means of a connection of the device 4 to the household electrical network, the electrical power supply means 28 in this case comprising a charger/accumulator assembly, for example. According to the latter two variants, the communication means 26 does not comprise a micro-USB 34 connector.

The data analysis means 24, the communication means 26, and the electrical power supply means 28 are all connected, for example, to a common printed circuit board, a suchlike printed circuit board not being depicted in the Figures for reasons of clarity.

Figure 3:
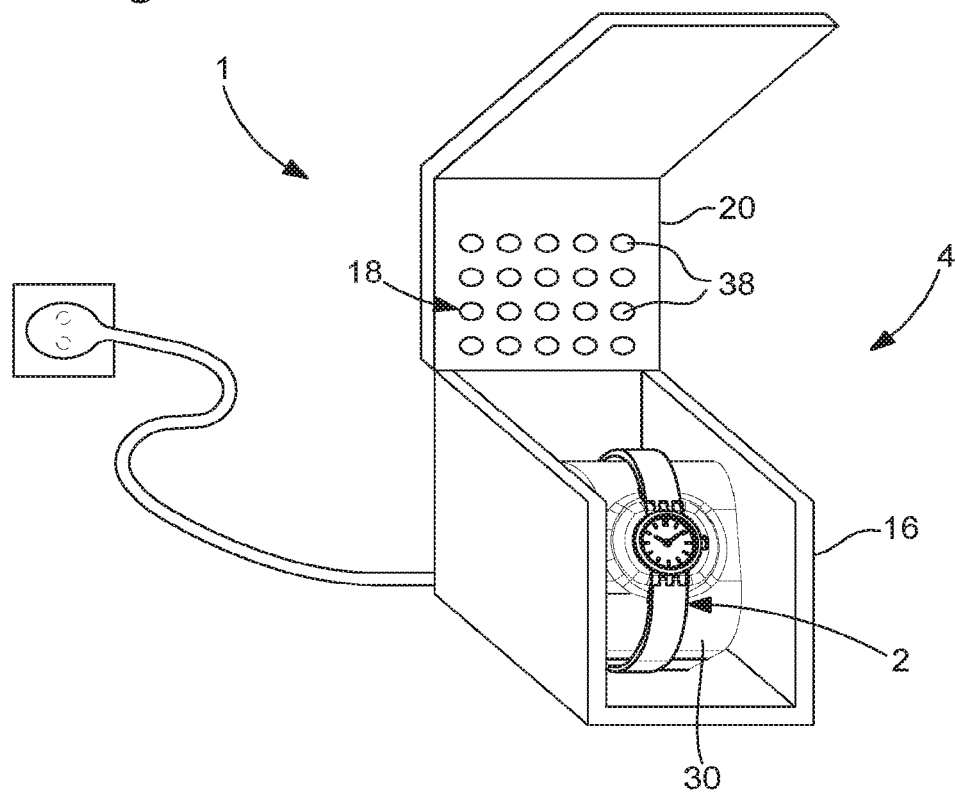
FIG. 3 is a perspective view of a recharging device for a solar-powered watch according to a first embodiment of the invention.

A first embodiment of the invention will now be described with reference to FIG. 3. According to this first embodiment, the source of energy 18 is a source of light, and the device 4 is a recharging device for a solar-powered watch 2. In a suchlike solar-powered watch 2, the auxiliary source of electrical energy 12 is adapted to convert luminous energy into electrical energy. The auxiliary source of electrical energy 12 is, for example, a photovoltaic cell, for example disposed on the dial 7 of the watch 2.

The source of light 18 comprises at least one light-emitting diode 38, for example. In the illustrative embodiment illustrated in FIG. 3, the source of light 18 comprises a plurality of light-emitting diodes 38 disposed in rows in the interior of the folding piece 20. More specifically, the light-emitting diodes 38 are secured in the interior of the folding piece 20 so as to be facing towards the auxiliary source of electrical energy 12 for the watch 2 when the folding piece 20 is closed onto the casket 16 and when the watch 2 is placed on the receiving support 30. The source of light 18 is capable, for example, of being activated by the data analysis means 24, and is configured in order to be capable of being activated permanently or, as a variant, at regular programmable intervals.

Preferably, according to this first embodiment of the invention, the recharging device 4 further comprises means for optimizing the light spectrum of the source of light 18, depending on at least one predetermined characterizing feature of the auxiliary source of electrical energy 12 for the watch 2. The means for optimizing the light spectrum are constituted, for example, by the data analysis means 24, which may store a correspondence table between information of types or models of watches and predetermined luminous characterizing features of auxiliary sources of electrical energy 12. Depending on the type and/or the model of the watch 2 placed on the receiving support 30, the data analysis means 24 are then configured in order to control and adjust the light spectrum of the source of light 18, with a view to optimizing this light spectrum and adapting it to the luminous characterizing features of the auxiliary source of electrical energy 12 for the watch 2. This makes it possible to optimize and adjust precisely the quantity of energy supplied by the device 4, in order to extend the service life of the means for the storage of electrical energy 11 for the watch 2, as well as that consumed by the recharging device.

A second embodiment of the invention will now be described with reference to FIG. 4. According to this second embodiment, the source of energy 18 is a thermal source, and the device 4 is a recharging device for a thermic or thermoelectric watch 2. In a suchlike thermic or thermoelectric watch 2, the auxiliary source of electrical energy 12 is adapted to convert thermal energy into electrical energy. The auxiliary source of electrical energy 12 is a thermoelectric generator, for example. A suchlike thermoelectric generator is a semi-conductor device, for example a semi-conductor device providing a P-N junction. A suchlike P-N junction is constituted, for example, by elements made of bismuth telluride ($Bi_2Te_3$). Semi-conductor thermoelectric generators are configured in order to convert a thermal flux (in the form of a temperature differential) directly into electrical energy via a phenomenon known as the Seebeck effect (a form of thermoelectric effect). Suchlike thermoelectric generators operate like thermal engines, but take up less space and have no moving parts. In the illustrative example in FIG. 4, the thermoelectric generator 12 is arranged in the interior of the watch case 5, between the dial 7 and the back 32 of the watch case 5.

The thermal source 18 is configured to apply a temperature gradient in the interior of the recharging device 4.

Figure 4:
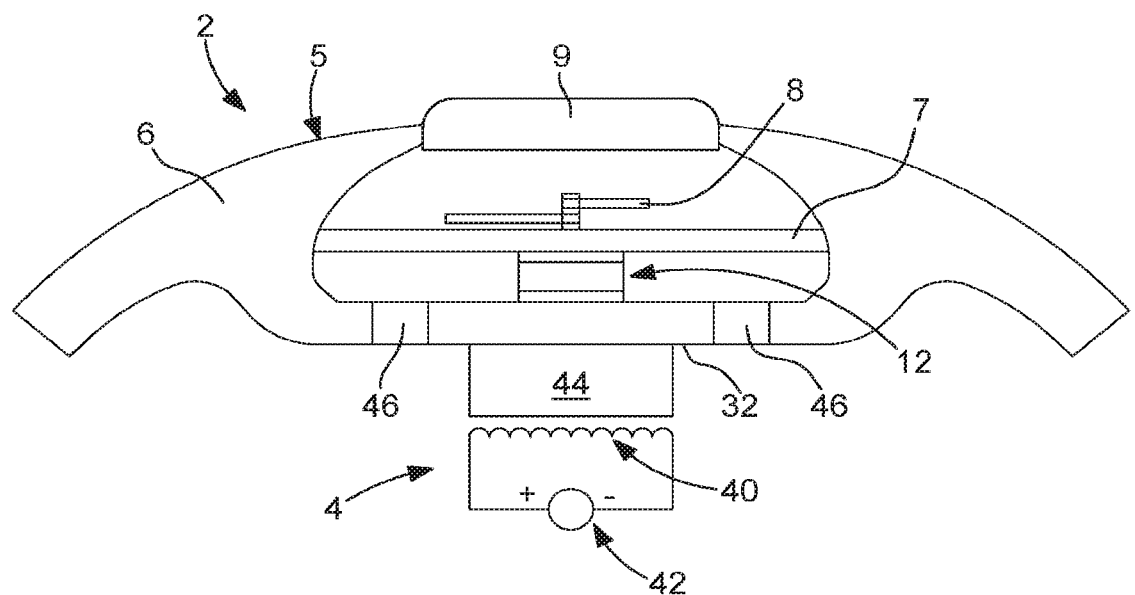
FIG. 4 is a view in vertical section of a part of a recharging device for a thermic or thermoelectric watch according to a second embodiment of the invention.

According to a first variant of the second embodiment, illustrated in FIG. 4, the thermal source 18 is a thermal source capable of being activated by the data analysis means 24. The thermal source 18 is configured in order, when activated, to apply cycles of temperature, and thus thermal gradients, to the interior of the device 4. Preferably, the thermal source 18 is adapted to be activated at regular programmable intervals. In this first variant embodiment illustrated in FIG. 4, the thermal source 18 comprises, for example, a heating element 40, an electrical source 42 connected in series to the heating element 40, and a fitting 44 in contact with the back 32 of the watch case 5. The heating element 40 is constituted, for example, by a resistive heating element or even by a serpentine resistance element. The heating element 40 may be replaced by a cooling element without modifying the operation of this variant embodiment. The electrical source 42 is a source of electrical voltage, for example. The fitting 44, which belongs to the receiving support 30, is arranged facing towards the heating element 40 and is constituted by a metallic material. The metallic material is aluminium, for example. In this variant embodiment illustrated in FIG. 4, the back 32 of the watch case 5 is made from a heat-conductive material, preferably a metallic material. The back 32 is separated from the rest of the watch case 5 by an annular zone 46 made from a thermally insulating material.

According to a second variant of the second embodiment, not depicted in the Figures, the recharging device 4 comprises two sources of thermal energy 18. A first thermal source 18 comprises a heating element arranged in the casket 16 so that it is in contact with the back 32 of the watch case 5 when the watch 2 is placed on the receiving support 30. A second source of energy 18 comprises a cooling element arranged in the device 4 so that it is in contact with the case middle 6 of the watch 2 when the watch 2 is placed on the receiving support 30. In this way, the two thermal sources 18 apply a constant thermal gradient to the interior of the device 4. The heating element is constituted, for example, by a resistive heating element or even by a serpentine resistance element. The cooling element is an active cooling element, for example, such as a Peltier element or even a fan. As a variant, the cooling element is a passive cooling element such as a radiator made of aluminium, for example, in contact with the case middle 6 of the watch 2.

According to the type and/or the model of the watch 2 and also the type of thermoelectric generator 12 utilised, the thermal gradient between the case middle 6 of the watch 2 and the back 32 of the watch case 5 preferably lies within a range between 0.1° C. and 10° C. Temperature measurement is performed by means of two thermometers, for example, a first thermometer being in contact with the hot part, that is to say the back 32 of the watch 2, and a second thermometer being in contact with the cold part, that is to say the case middle 6 of the watch 2. The two thermometers are thermocouples, for example. A simple closed loop system of the PID type (Proportional Integral Derivative) is then used to regulate the thermal gradient in the interior of the device 4.

Preferably, according to this second embodiment of the invention, the recharging device 4 further comprises means for optimizing the thermal gradient in the interior of the device 4, depending on at least one predetermined characterizing feature of the watch 2 and/or of the auxiliary source of electrical energy 12 for the watch 2. The means for optimizing the thermal gradient are constituted by the data analysis means 24, for example, which may store a correspondence table between information about the types or models of watches and predetermined thermal characteristics of auxiliary sources of electrical energy 12. Depending on the type and/or the model of the watch 2 placed on the receiving support 30, the data analysis means 24 are then configured in order to control and adjust the thermal gradient emitted by the thermal source 18, with a view to optimizing this thermal gradient and adapting it to the thermal characterizing features of the auxiliary source of electrical energy 12 for the watch 2. This makes it possible to optimise and adjust precisely the quantity of energy supplied by the device 4, in order to extend the service life of the means for the storage of electrical energy 11 for the watch 2 with minimal consumption by the recharging device.

The operation of the recharging device 4 according to the invention will now be described. The watch 2 is placed initially in the casket 16 of the recharging device 4, on the receiving support 30.

The procedure for recharging the watch 2, implemented by the device 4, may be triggered or initiated manually by a user, or automatically.

The procedure may comprise an initial stage, in the course of which a user of the device 4 enters information relating to the type or to the model of the watch 2 via the communication interface 36. As a variant, the watch 2 is equipped with a chip, for example a chip of the NFC type (from the English Near Field Communication), storing information relating to the auxiliary source of electrical energy 12 for the watch 2, more particularly luminous or thermal characterizing features. The device 4 is then configured to read suchlike information within the chip when the watch 2 is placed on the receiving support 30.

In the case of manual triggering of the procedure by a user, the latter, after having closed the folding piece 20, then pushes a button for triggering the procedure, for example.

In the case in which the recharging device 4 comprises a sensor 22 for the presence of the watch 2 and/or the closing of the folding piece 20, triggering of the recharging procedure is performed automatically, following detection by the sensor 22. The sensor 22 then transmits a detection signal to the analysis means 24, which triggers the procedure for recharging the watch 2.

In both cases, the one or more source(s) of energy 18, controlled by the analysis means 24, trigger an emission of energy intended for the auxiliary source of electrical energy 12 for the watch 2. The analysis means 24 preferably access predetermined characterising features of the auxiliary source of electrical energy 12 for the watch 2, for example via a correspondence table, and more particularly characterizing features of the thermal or luminous power or of the light spectrum. The analysis means 24 are then able to optimize and adjust precisely the quantity of energy supplied by the one or more source(s) of energy 18 depending on the type of auxiliary source of electrical energy 12 used. The auxiliary source of electrical energy 12 then converts the received energy into electrical energy and delivers a charge for maintaining a predetermined level of power supply voltage to the means for the storage of electrical energy 11, permitting recharging of the watch 2 with minimal consumption by the recharging device.

The invention claimed is:

1. An assembly comprising:
    an electronic or electromechanical watch; and
    recharging device for said watch, said watch comprising a means for the storage of electrical energy being configured to power electronic components of the watch, and an auxiliary source of electrical energy being configured to electrically power the means for the storage of electrical energy directly and electrically without intermediate mechanical conversion for recharging thereof, the recharging device comprising:
    a casket provided with a support configured to receive the watch;
    at least one source of energy configured to supply energy to the auxiliary source of electrical energy for the watch when the watch is placed on the support, wherein said at least one source of energy is a source of light;
    a sensor configured to sense a presence of the watch and/or a closing of the casket;
    a data analysis microprocessor configured to activate the at least one source of energy upon receipt of a detection signal from the sensor, and to, in response to receiving a type or model of the watch, adjust a light spectrum of the source of light to control a quantity of energy supplied from the at least one source of energy to the auxiliary source of electrical energy,
    wherein the device comprises a folding piece mounted on the casket, and the source of light comprises at least one light-emitting diode fixed to an interior of the folding piece so as to be facing towards the auxiliary source of electrical energy of the watch when the folding piece is closed onto the casket and when the watch is placed on the support, and wherein the sensor is further configured to sense the presence of the watch and to sense the closing of the casket upon closing of the folding piece, the sensor being configured to send the detect signal in response to sensing the presence of the watch and the closing of the casket so that the source of energy releases energy for the watch based on the detection signal received by the microprocessor from the sensor.

2. The assembly according to claim 1, wherein the auxiliary source of electrical energy for the watch is configured to convert luminous energy from the source of light into electrical energy for the watch.

3. The assembly according to claim 1,
    wherein the electronic or electromechanical watch further comprises an energy extractor connecting the auxiliary source of electrical energy to the means for the storage of electrical energy, and
    wherein the auxiliary source of electrical energy is further configured to convert energy received from the at least one source of energy into electrical energy when the watch is placed on the support.

4. The assembly according to claim 2, wherein the data analysis microprocessor is programmed to store information in a correspondence table of types or models of watches and predetermined luminous characterizing features of auxiliary sources of electrical energy.

5. The assembly according to claim 2, wherein the data analysis microprocessor is configured to adjust the light spectrum of the source of light to omit an infra-red part of the light spectrum.

6. The assembly according to claim 1, further comprising means for optimising the light spectrum of the source of light, depending on at least one predetermined characterising feature of the auxiliary source of electrical energy for the watch.

7. The assembly according to claim 1, wherein the means for storage of electrical energy is an electrical capacitor.

8. The assembly according to claim 1, wherein the means for storage of electrical energy is a battery.

9. The assembly according to claim 1, wherein the device is a box to receive the watch.

10. The assembly according to claim 3, wherein the energy extractor comprises an oscillating circuit, a clock signal generator, and one or a plurality of switches associated with a common control circuit.

11. The assembly according to claim 10, wherein the oscillating circuit is an LC oscillating circuit, and the clock signal generator is a quartz oscillator.

12. The assembly according to claim 1, wherein the microprocessor is configured to activate the at least one source of energy at regular intervals while receiving the detection signal from the sensor.

* * * * *